United States Patent
Inatomi et al.

(10) Patent No.: US 12,404,587 B2
(45) Date of Patent: Sep. 2, 2025

(54) SUBSTRATE PROCESSING APPARATUS AND SUBSTRATE PROCESSING METHOD

(71) Applicant: Tokyo Electron Limited, Tokyo (JP)

(72) Inventors: Yuichiro Inatomi, Kumamoto (JP); Yusaku Hashimoto, Koshi (JP); Takafumi Niwa, Kumamoto (JP)

(73) Assignee: TOKYO ELECTRON LIMITED, Tokyo (JP)

(*) Notice: Subject to any disclaimer, the term of this patent is extended or adjusted under 35 U.S.C. 154(b) by 158 days.

(21) Appl. No.: 17/908,693

(22) PCT Filed: Feb. 18, 2021

(86) PCT No.: PCT/JP2021/006078
§ 371 (c)(1),
(2) Date: Sep. 1, 2022

(87) PCT Pub. No.: WO2021/177047
PCT Pub. Date: Sep. 10, 2021

(65) Prior Publication Data
US 2023/0098105 A1    Mar. 30, 2023

(30) Foreign Application Priority Data
Mar. 4, 2020   (JP) ................. 2020-036761

(51) Int. Cl.
*C23C 18/16* (2006.01)
*B05B 13/02* (2006.01)
*B05C 11/10* (2006.01)

(52) U.S. Cl.
CPC ............ *C23C 18/163* (2013.01); *B05B 13/02* (2013.01); *B05C 11/1015* (2013.01); *C23C 18/1676* (2013.01)

(58) Field of Classification Search
USPC ..... 118/52, 612, 320, 302, 666, 667, 58–60, 118/500; 427/240
See application file for complete search history.

(56) References Cited

U.S. PATENT DOCUMENTS

| | | | |
|---|---|---|---|
| 2007/0199507 A1* | 8/2007 | Pancham | H01L 21/67109 118/202 |
| 2009/0095712 A1* | 4/2009 | Yamauchi | H01L 21/67075 156/345.23 |

(Continued)

FOREIGN PATENT DOCUMENTS

| | | |
|---|---|---|
| JP | H10-242255 A | 9/1998 |
| JP | 2003-001182 A | 1/2003 |

(Continued)

OTHER PUBLICATIONS

English Translation JP-4283366-B2 (Year: 2009).*

(Continued)

*Primary Examiner* — Yewebdar T Tadesse
(74) *Attorney, Agent, or Firm* — Chrisman Gallo Tochtrop LLC

(57) ABSTRACT

A substrate processing apparatus 5 includes a holder 52 (52A), a supply 53 and a cover body 6. The holder 52 (52A) is configured to attract and hold a substrate W. The supply 53 is configured to supply a heated plating liquid to the substrate W attracted to and held by the holder 52 (52A). The cover body 6 is configured to cover the substrate W attracted to and held by the holder 52 (52A), and heat the plating liquid on the substrate W by using a heating device 63 provided in a ceiling member 61 thereof facing a top surface of the substrate W. The holder 52 (52A) includes protrusions 130 projecting from a facing surface 110 thereof facing a bottom surface of the substrate W toward the bottom surface (Continued)

of the substrate W, and each protrusion has a protruding height equal to or larger than 1 mm.

15 Claims, 10 Drawing Sheets

(56) References Cited

U.S. PATENT DOCUMENTS

| | | | |
|---|---|---|---|
| 2015/0034010 A1 | 2/2015 | Lee et al. | |
| 2017/0315454 A1* | 11/2017 | Laurent | G03F 7/70716 |
| 2018/0002811 A1* | 1/2018 | Motomatsu | C23C 18/163 |
| 2018/0374736 A1* | 12/2018 | Kumar | H01L 21/6704 |

FOREIGN PATENT DOCUMENTS

| | | | | |
|---|---|---|---|---|
| JP | 2003-332213 A | 11/2003 | | |
| JP | 2005-133160 A | 5/2005 | | |
| JP | 2006-049449 A | 2/2006 | | |
| JP | 4283366 B2 * | 6/2009 | | |
| JP | 2013-105867 A | 5/2013 | | |
| JP | 2018-003097 A | 1/2018 | | |
| WO | WO-2005045921 A1 * | 5/2005 | | H01L 21/6833 |
| WO | WO-2018003826 A1 * | 1/2018 | | C25D 17/001 |
| WO | 2019/044548 A1 | 3/2019 | | |
| WO | 2020/031679 A1 | 2/2020 | | |

OTHER PUBLICATIONS

English Translation WO-2018003826-A1 (Year: 2018).*
International Search Report for PCT/JP2021/006078 dated Mar. 23, 2021.

* cited by examiner

SUBSTRATE PROCESSING APPARATUS AND SUBSTRATE PROCESSING METHOD

CROSS-REFERENCE TO RELATED APPLICATIONS

This Application is a U.S. national phase application under 35 U.S.C. § 371 of PCT Application No. PCT/JP2021/006078 filed on Feb. 18, 2021, which claims the benefit of Japanese Patent Application No. 2020-036761 filed on Mar. 4, 2020, the entire disclosures of which are incorporated herein by reference.

TECHNICAL FIELD

The various aspects and embodiments described herein pertain generally to a substrate processing apparatus and a substrate processing method.

BACKGROUND

Conventionally, there is known a technique of performing a plating processing on a substrate such as a semiconductor wafer by using a plating liquid. Patent Document 1 discloses a technique of forming a plating film on a substrate through processes of accumulating a plating liquid on a top surface of the substrate, covering the substrate with a cover body, and then heating the plating liquid on the substrate by using a heater provided in the cover body.

Patent Document 1: Japanese Patent Laid-open Publication No. 2005-133160

SUMMARY

In an exemplary embodiment, a substrate processing apparatus includes a holder, a supply and a cover body. The holder is configured to attract and hold a substrate. The supply is configured to supply a heated plating liquid to the substrate attracted to and held by the holder. The cover body is configured to cover the substrate attracted to and held by the holder, and configured to heat the plating liquid on the substrate by using a heating device provided in a ceiling member thereof facing a top surface of the substrate. The holder is provided with multiple protrusions projecting from a facing surface thereof facing a bottom surface of the substrate toward the bottom surface of the substrate, and each protrusion has a protruding height equal to or larger than 1 mm.

DETAILED DESCRIPTION

Figure 1:
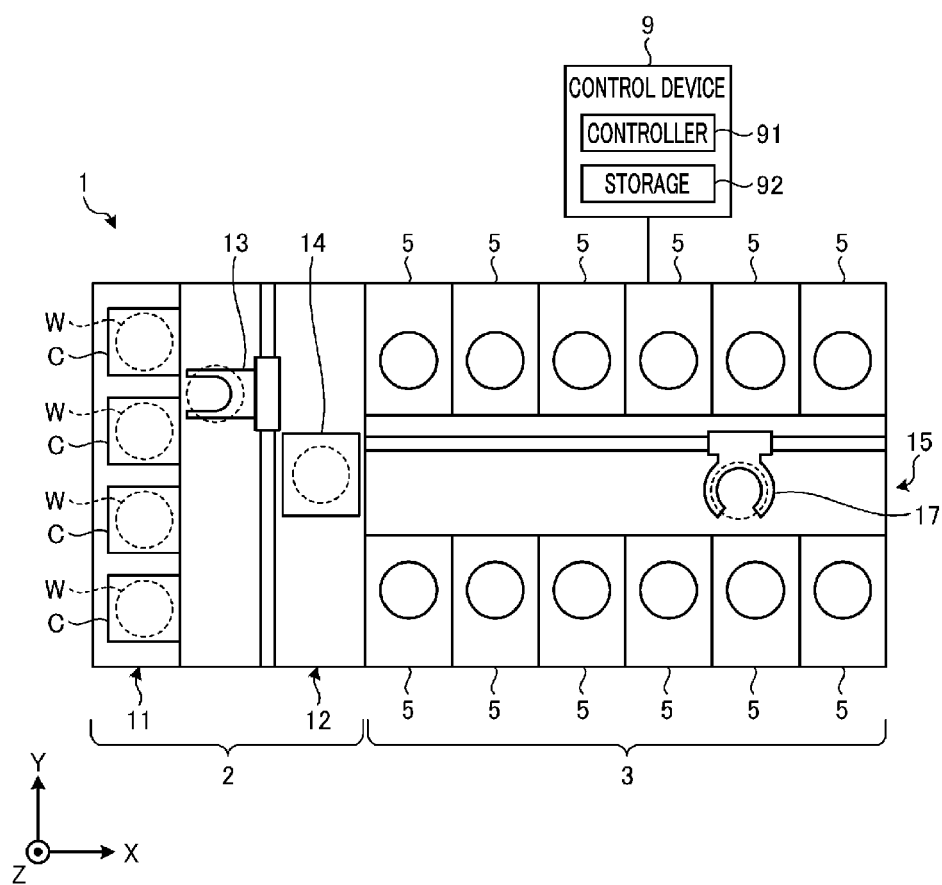
FIG. 1 is a diagram illustrating a configuration of a substrate processing apparatus according to an exemplary embodiment.

Hereinafter, embodiments for a substrate processing apparatus and a substrate processing method according to the present disclosure (hereinafter, referred to as "exemplary embodiments") will be described in detail with reference to the accompanying drawings. Further, it should be noted that the present disclosure is not limited by the exemplary embodiments. Further, unless processing contents are contradictory, the various exemplary embodiments can be appropriately combined. Furthermore, in the various exemplary embodiments to be described below, same parts will be assigned same reference numerals, and redundant description will be omitted.

Further, in the following exemplary embodiments, expressions such as "constant," "perpendicular," "vertical" and "parallel" may be used. These expressions, however, do not imply strictly "constant", "perpendicular," "vertical" and "parallel". That is, these expressions allow some tolerable errors in, for example, manufacturing accuracy, installation accuracy, or the like.

Moreover, in the various accompanying drawings, for the purpose of clear understanding, there may be used a rectangular coordinate system in which the X-axis direction, Y-axis direction and Z-axis direction which are orthogonal to one another are defined and the positive Z-axis direction is defined as a vertically upward direction. Further, a rotational direction around a vertical axis may be referred to as "θ direction."

<Configuration of Substrate Processing Apparatus>

FIG. 1 is a diagram illustrating a configuration of a substrate processing apparatus according to an exemplary embodiment. As depicted in FIG. 1, the substrate processing apparatus 1 is equipped with a carry-in/out station 2 and a processing station 3. The carry-in/out station 2 and the processing station 3 are provided adjacent to each other.

The carry-in/out station 2 is equipped with a carrier placing table 11 and a transfer section 12. On the carrier placing table 11, a plurality of carriers C is placed to horizontally accommodate therein a plurality of substrates, for example, semiconductor wafers W (hereinafter, referred to as "substrates W") in the present exemplary embodiment.

On the carrier placing table 11, a plurality of load ports are arranged so as to be adjacent to the transfer section 12, and the carriers C correspond to the plurality of load ports in one-to-one correspondence.

The transfer section 12 is provided adjacent to the carrier placing table 11, and is equipped with a substrate transfer device 13 and a delivery unit 14. The substrate transfer device 13 is equipped with a wafer holding mechanism configured to hold the substrate W. Further, the substrate transfer device 13 is movable in a horizontal direction and a vertical direction, and pivotable around a vertical axis, and serves to transfer the substrate W between the carrier C and the delivery unit 14 by using the wafer holding mechanism.

The processing station 3 is provided adjacent to the transfer section 12. The processing station 3 is equipped with a transfer section 15 and a plurality of plating units 5. The plurality of plating units 16 are arranged on both sides of the transfer section 15. A configuration of the plating unit 5 will be elaborated later.

The transfer section 15 has therein a substrate transfer device 17. The substrate transfer device 17 is equipped with a wafer holding mechanism configured to hold the substrate W. Further, the substrate transfer device 17 is movable in a horizontal direction and a vertical direction and pivotable around a vertical axis, and transfers the substrate W between the delivery unit 14 and the plating unit 5 by using the wafer holding mechanism.

Further, the substrate processing apparatus 1 is equipped with a control device 9. The control device 9 is, for example, a computer, and includes a controller 91 and a storage 92. The storage 92 stores therein a program for controlling various processings performed in the substrate processing apparatus 1. The controller 91 controls an operation of the substrate processing apparatus 1 by reading and executing the program stored in the storage 92.

Further, the program may be recorded in a computer-readable recording medium, and may be installed from the recording medium to the storage 92 of the control device 9. The computer-readable recording medium may be, for example, a hard disk (HD), a flexible disk (FD), a compact disk (CD), a magneto optical disc (MO), a memory card, or the like.

In the substrate processing apparatus 1 configured as described above, the substrate transfer device 13 of the carry-in/out station 2 first takes out the substrate W from the carrier C placed on the carrier placing table 11, and then places the taken substrate W in the delivery unit 14. The substrate W placed in the delivery unit 14 is taken out from the delivery unit 14 by the substrate transfer device 17 of the processing station 3, and carried into the plating unit 5 to be processed therein. By way of example, a recess such as a trench or a via is formed in a front surface of the substrate W, and the plating unit 5 fills this recess with a metal by an electroless plating method.

The substrate W processed by the plating unit 16 is carried out of the plating unit 5 by the substrate transfer device 17 and placed in the delivery unit 14. The substrate W placed in the delivery unit 14 after being completely processed is returned back into the carrier C on the carrier placing table 11 by the substrate transfer device 13.

<Configuration of Plating Unit>

Figure 2:
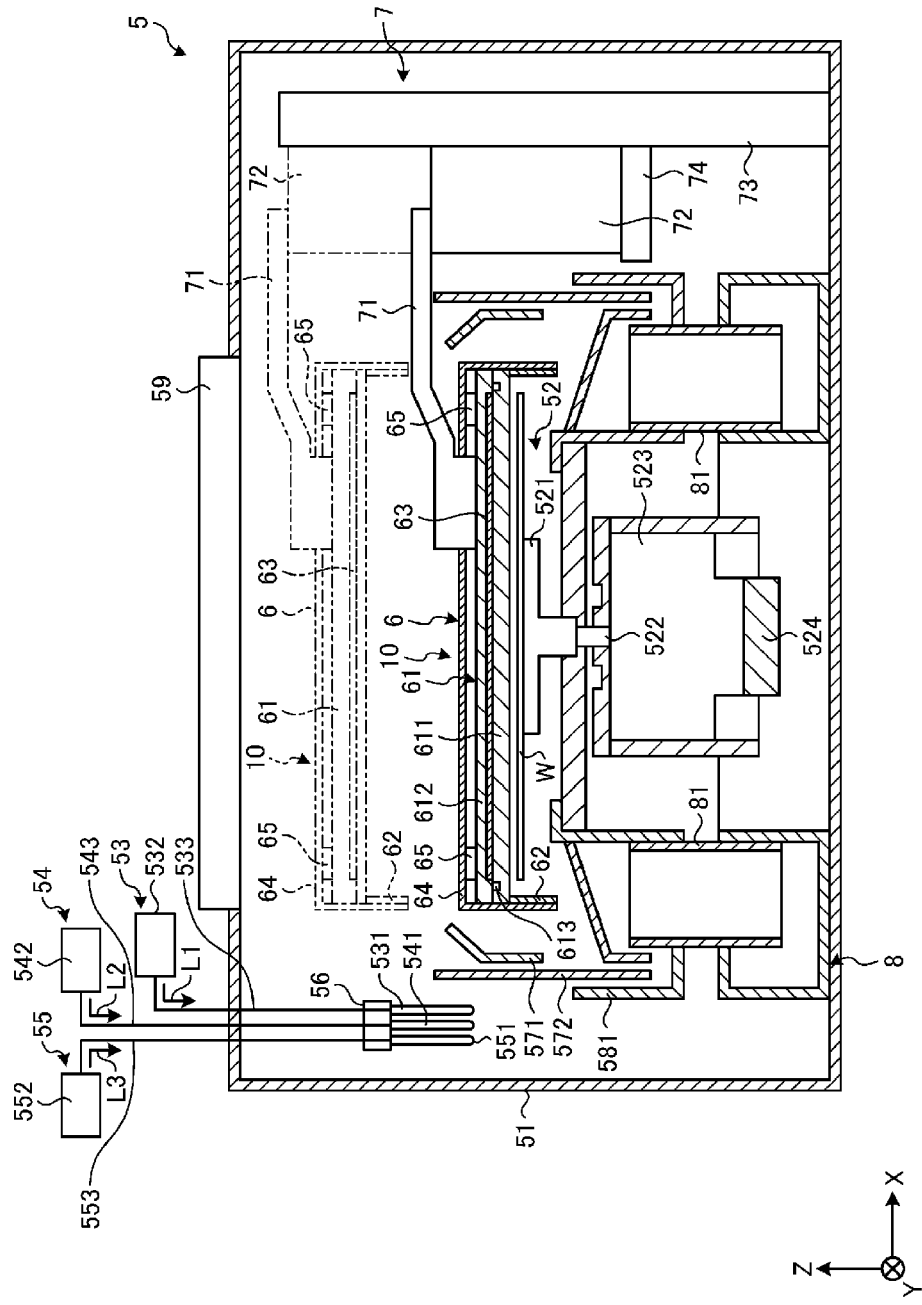
FIG. 2 is a diagram illustrating a configuration of a plating unit according to the exemplary embodiment.

Now, the configuration of the plating unit 5 will be explained with reference to FIG. 2. FIG. 2 is a diagram illustrating the configuration of the plating unit 5.

The plating unit 5 is configured to perform a liquid processing including an electroless plating processing. The plating unit 5 includes a chamber 51; a holder 52 disposed in the chamber 51 and configured to hold the substrate W horizontally; and a plating liquid supply 53 configured to supply a plating liquid L1 (processing liquid) onto the front surface (top surface) of the substrate W held by the holder 52.

In the present exemplary embodiment, the holder 52 has a chuck member 521 configured to vacuum-attract a bottom surface (rear surface) of the substrate W. This chuck member 521 is configured as a so-called vacuum chuck type.

The holder 52 is made of a carbon PEEK (polyether ether ketone) resin. The carbon PEEK is a PEEK resin (carbon fiber-reinforced PEEK resin) containing carbon fibers.

The holder 52 is connected to a rotation motor 523 (rotational driving unit) via a rotation shaft 522. When this rotation motor 523 is driven, the holder 52 is rotated along with the substrate W. The rotation motor 523 is supported on a base 524 which is fixed to the chamber 51. In addition, a heating source, such as a heater, is not provided within the holder 52.

The plating liquid supply 53 includes a plating liquid nozzle 531 configured to discharge (supply) the plating liquid L1 onto the substrate W held by the holder 52; and a plating liquid source 532 configured to supply the plating liquid L1 to the plating liquid nozzle 531. Here, the plating liquid source 532 is configured to supply the plating liquid L1 heated or regulated to a predetermined temperature to the plating liquid nozzle 531 through a plating liquid line 533. The temperature of the plating liquid L1 at the moment when it is discharged from the plating liquid nozzle 531 may be in the range of, e.g., 55° C. to 75° C., and, more desirably, in the range of 60° C. to 70° C. The plating liquid nozzle 531 is held by a nozzle arm 56 and is configured to be movable.

The plating liquid L1 is an autocatalytic (reduction) plating liquid for electroless plating. The plating liquid L1 contains, for example, a metal ion and a reducing agent. The metal ion contained in the plating liquid L1 may be, by way of non-limiting example, a cobalt (Co) ion, a nickel (Ni) ion, a tungsten (W) ion, a copper (Cu) ion, a palladium (Pd) ion, a gold (Au) ion, a ruthenium (Ru) ion, or the like. Further, the reducing agent included in the plating liquid L1 may be hypophosphorous acid, dimethylamine borane, glyoxylic acid, or the like. A plating film formed by the plating processing using the plating liquid L1 may be, by way of non-limiting example, CoWB, CoB, CoWP, CoWBP, NiWB, NiB, NiWP, NiWBP, Cu, Pd, Ru, or the like. Further, the plating film may be formed of a single layer or may be formed of two or more layers. When the plating film has a double-layer structure, it may have a layer structure of CoWB/CoB or Pd/CoB stacked in sequence from a base metal layer (seed layer) side.

The plating unit 5 is further equipped with a cleaning liquid supply 54 configured to supply a cleaning liquid L2 onto the front surface of the substrate W held by the holder 52; and a rinse liquid supply 55 configured to supply a rinse liquid L3 onto the front surface of the substrate W.

The cleaning liquid supply 54 supplies the cleaning liquid L2 onto the substrate W held and rotated by the holder 52 to pre-clean a seed layer formed on the substrate W. This cleaning liquid supply 54 includes a cleaning liquid nozzle 541 configured to discharge the cleaning liquid L2 onto the substrate W held by the holder 52; and a cleaning liquid source 542 configured to supply the cleaning liquid L2 to the cleaning liquid nozzle 541. Here, the cleaning liquid source 542 is configured to supply the cleaning liquid L2 heated or regulated to a preset temperature to the cleaning liquid nozzle 541 through a cleaning liquid line 543, as will be described later. The cleaning liquid nozzle 541 is held by the nozzle arm 56 and is configured to be moved along with the plating liquid nozzle 531.

Dicarboxylic acid or tricarboxylic acid may be used as the cleaning liquid L2. As an example of the dicarboxylic acid, an organic acid such as a malic acid, a succinic acid, a malonic acid, an oxalic acid, a glutaric acid, an adipic acid, or a tartaric acid may be used. Further, as an example of the tricarboxylic acid, an organic acid such as a citric acid may be used.

The rinse liquid supply 55 is equipped with a rinse liquid nozzle 551 configured to discharge the rinse liquid L3 onto the substrate W held by the holder 52; and a rinse liquid source 552 configured to supply the rinse liquid L3 to the rinse liquid nozzle 551. Here, the rinse liquid nozzle 551 is held by the nozzle arm 56 and is configured to be moved along with the plating liquid nozzle 531 and the cleaning liquid nozzle 541. Further, the rinse liquid source 552 is configured to supply the rinse liquid L3 to the rinse liquid nozzle 551 through a rinse liquid line 553. The rinse liquid L3 may be, by way of non-limiting example, DIW or the like.

A non-illustrated nozzle moving mechanism is connected to the nozzle arm 56 holding the plating liquid nozzle 531, the cleaning liquid nozzle 541 and the rinse liquid nozzle 551 as described above. This nozzle moving mechanism is configured to move the nozzle arm 56 in a horizontal direction and a vertical direction. To be more specific, the nozzle arm 56 is configured to be moved by the nozzle moving mechanism between a discharge position where the processing liquid (the plating liquid L1, the cleaning liquid L2 or the rinse liquid L3) is discharged onto the substrate W and a retreat position where the nozzle arm 56 is retreated from the discharge position. Here, the discharge position is not particularly limited as long as the processing liquid can be supplied to a certain position on the front surface of the substrate W. By way of example, it is desirable that the discharge position is set such that the processing liquid can be supplied to the center of the substrate W. The discharge position of the nozzle arm 56 may be set to be different between the cases when the plating liquid L1 is supplied, when the cleaning liquid L2 is supplied, and when the rinse liquid L3 is supplied onto the substrate W. The retreat position is a position within the chamber 51 which is not overlapped with the substrate W when viewed from above, and far from the discharge position. When the nozzle arm 56 is placed at the retreat position, interference between the nozzle arm 56 and a cover body 6 being moved is avoided.

A cup 571 is disposed around the holder 52. The cup 571 is formed to have a ring shape when viewed from above, and serves to receive the processing liquid scattered from the substrate W when the substrate W is rotated and guide the received processing liquid to a drain duct 581. An atmosphere blocking cover 572 is provided around the cup 571 to suppress diffusion of an atmosphere around the substrate W into the chamber 51. This atmosphere blocking cover 572 has a vertically extending cylinder shape with an open top. The cover body 6 to be described later is configured to be inserted into the atmosphere blocking cover 572 from above.

The substrate W held by the holder 52 is covered with the cover body 6. This cover body 6 has a ceiling member 61 facing the top surface of the substrate W; and a sidewall member 62 extending downwards from the ceiling member 61.

The ceiling member 61 includes a first ceiling plate 611 and a second ceiling plate 612 provided on the first ceiling plate 611. A heating device 63 is disposed between the first ceiling plate 611 and the second ceiling plate 612. The first ceiling plate 611 and the second ceiling plate 612 are configured to seal the heating device 63 such that the heating device 63 may not come into contact with the processing liquid such as the plating liquid L1. To be more specific, a seal ring 613 is disposed around the heating device 63, and the heating device 63 is sealed by this seal ring 613. Desirably, the first ceiling plate 611 and the second ceiling plate 612 have corrosion resistance against the processing liquid such as the plating liquid L1, and may be formed of, by way of example, an aluminium alloy. Further, to enhance the corrosion resistance, the first ceiling plate 611, the second ceiling plate 612 and the sidewall member 62 may be coated with Teflon (registered trademark).

A cover body moving mechanism 7 is connected to the cover body 6 with a cover body arm 71 therebetween. The cover body moving mechanism 7 is configured to move the cover body 6 in a horizontal direction and a vertical direction. To be more specific, the cover body moving mechanism 7 includes a revolving motor 72 configured to move the cover body 6 in the horizontal direction; and a cylinder 73 (distance adjuster) configured to move the cover body 6 in the vertical direction. Here, the revolving motor 72 is provided on a supporting plate 74 configured to be movable vertically with respect to the cylinder 73. Instead of the cylinder 73, an actuator (not shown) including a motor and a ball screw may be used.

The revolving motor 72 of the cover body moving mechanism 7 is configured to move the cover body 6 between an upper position above the substrate W held by the holder 52 and a retreat position retreated from the upper position. Here, the upper position is a position facing the substrate W held by the holder 52 with a relatively large gap therebetween and overlapped with the substrate W when viewed from above. The retreat position is a position within the chamber 51 which is not overlapped with the substrate W when viewed from above. When the cover body 6 is located at the retreat position, interference between the cover body 6 and the nozzle arm 56 being moved is avoided. A rotational axis of the revolving motor 72 extends vertically, and the cover body 6 is configured to be rotated horizontally between the upper position and the retreat position.

The cylinder 73 of the cover body moving mechanism 7 is configured to move the cover body 6 vertically to adjust the distance between the substrate W on which the plating liquid L1 has been supplied and the first ceiling plate 611 of the ceiling member 61. To be more specific, the cylinder 73 locates the cover body 6 at a lower position (a position indicated by a solid line in FIG. 2) or the upper position (a position indicated by a dashed double-dotted line in FIG. 2).

In the exemplary embodiment, the heating device 63 is driven to heat the plating liquid L1 on the substrate W or the holder 52 when the cover body 6 is placed at the aforementioned lower position.

The ceiling member 61 and the sidewall member 62 of the cover body 6 are covered with a cover lid 64. This cover lid 64 is disposed on the second ceiling plate 612 of the cover body 6 with a plurality of supporting members 65 therebetween. That is, the supporting members 65 protruding upwards from a top surface of the second ceiling plate 612 are provided on the second ceiling plate 612, and the cover lid 64 is placed on these supporting members 65. The cover lid 64 is configured to be moved in a horizontal direction and a vertical direction along with the cover body 6. Further, it is desirable that the cover lid 64 has heat insulation property higher than those of the ceiling member 61 and the sidewall member 62 to suppress heat within the cover body 6 from leaking to the vicinity thereof. By way of example, the cover lid 64 is desirably made of a resin material, and, more desirably, the resin material has heat resistance.

As described above, in the exemplary embodiment, the cover body 6 equipped with the heating device 63 is configured as one body with the cover lid 64, and a cover unit 10 configured to cover the holder 52 or the substrate W when located at the lower position is composed of the cover body 6 and the cover lid 64.

A fan filter unit 59 (gas supply) is provided at an upper portion of the chamber 51 to supply clean air (gas) to the vicinity of the cover body 6. The fan filter unit 59 supplies the air into the chamber 51 (particularly, into the atmosphere blocking cover 572), and the supplied air flows toward an exhaust line 81. A downflow of the air flowing downwards is formed around the cover body 6, and a gas vaporized from the processing liquid such as the plating liquid L1 flows toward the exhaust line 81 by being carried with this downflow. Accordingly, the gas vaporized from the processing liquid is suppressed from rising and diffusing into the chamber 51.

The gas supplied from the above-described fan filter unit 59 is exhausted by an exhaust mechanism 8.

<Regarding Temperature of Substrate in Plating Processing>

Figure 3:
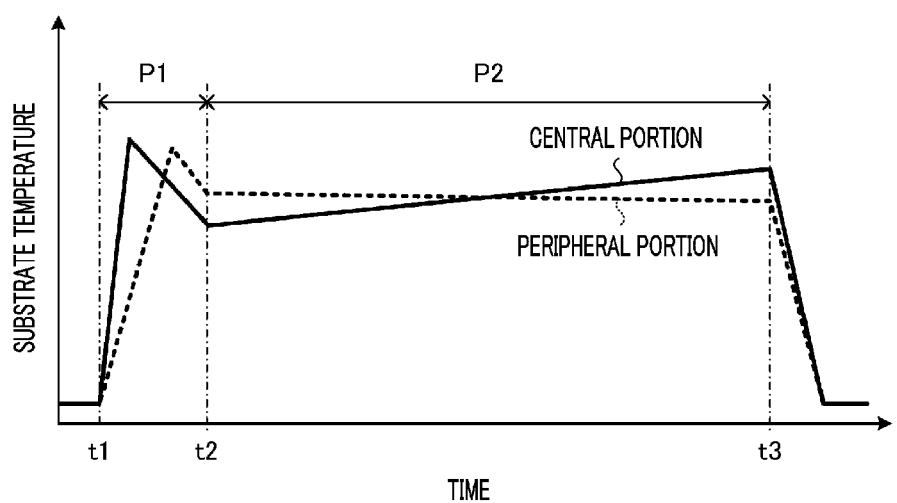
FIG. 3 is a graph showing a temperature variation of a substrate during a plating processing in a conventional substrate processing apparatus.

FIG. 3 is a graph showing temperature variations of a substrate during a plating processing in a conventional substrate processing apparatus. In FIG. 3, a solid line indicates a temperature variation at a central portion of the substrate, and a dashed line indicates a temperature variation at a peripheral portion of the substrate.

In the substrate processing apparatus, the plating liquid L1 is supplied to the substrate during a time period ranging from t1 to t2 (period P1), for example. Then, during a time period ranging from t2 to t3 (period P2), the state in which the plating liquid L1 is accumulated on the substrate is maintained.

In the period P1, the plating liquid is supplied to the central portion of the substrate, and is diffused to the peripheral portion of the substrate by the rotation of the holder. For this reason, in the period P1, the temperature of the central portion of the substrate rises ahead of the temperature rise of the peripheral portion, and the temperature of the peripheral portion rises afterwards.

In the period P2, in order to keep the temperature of the plating liquid on the substrate constant, the plating liquid on the substrate is heated to a regular temperature by the heating device provided in the cover body.

The holder, a rotation shaft, and so forth are located below the central portion of the substrate. For this reason, in the central portion of the substrate, heat reduction by the holder, the rotation shaft, and so forth may easily occur, as compared to the peripheral portion of the substrate. Under the influence of this heat reduction, the temperature of the central portion of the substrate becomes lower than the temperature of the peripheral portion of the substrate at an end time (time t2) of the period P1. That is, a temperature distribution in which the temperature of the central portion is lower than the temperature of the peripheral portion is generated in the substrate.

Meanwhile, in the period P2, the central portion of the substrate is affected by the heat accumulated in the holder and the rotation shaft. That is, in the period P2, the heat from the holder and the rotation shaft is applied to the central portion of the substrate in addition to the heat from the heating device provided in the cover body. Accordingly, while the temperature of the peripheral portion of the substrate is substantially constant in the period P2, the temperature of the center portion of the substrate rises in the period P2. As a result, the temperature of the central portion of the substrate becomes higher than the temperature of the peripheral portion of the substrate at an end time (time t3) of the period P2. That is, a temperature distribution in which the temperature of the central portion is higher than the temperature of the peripheral portion is generated in the substrate.

As stated above, in the conventional substrate processing apparatus, it has been difficult to maintain in-surface uniformity of the temperature of the substrate during the plating processing due to the thermal influence of the holder, the rotation shaft, and so forth. The thickness of the plating film depends on the temperature of the plating liquid. For this reason, if the in-surface uniformity of the temperature of the substrate in the plating processing is low, it becomes difficult to form the plating film with the uniform film thickness on the substrate.

In view of the foregoing, in the plating unit 5 according to the exemplary embodiment, the structure of the holder 52 is designed such that heat conduction from the substrate W to the holder 52 can be minimized. In addition, in the plating unit 5 according to the exemplary embodiment, by heating the central portion and the peripheral portion of the substrate W at different heating temperatures, further improvement of the in-surface uniformity of the temperature of the substrate W can be achieved. For the purpose, in the plating unit 5 according to the exemplary embodiment, the heating device 63 provided in the cover body 6 has a divided structure.

<Configuration of Holder>

Figure 4:
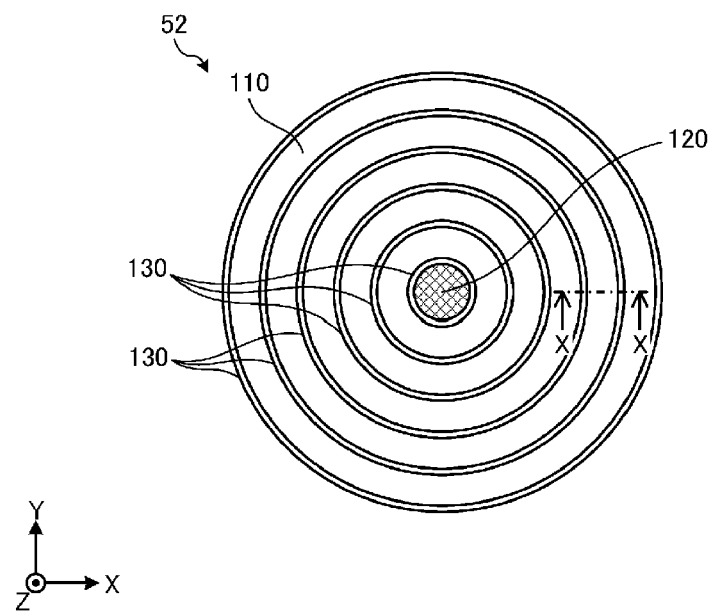
FIG. 4 is a plan view of a holder according to the exemplary embodiment.
Figure 5:
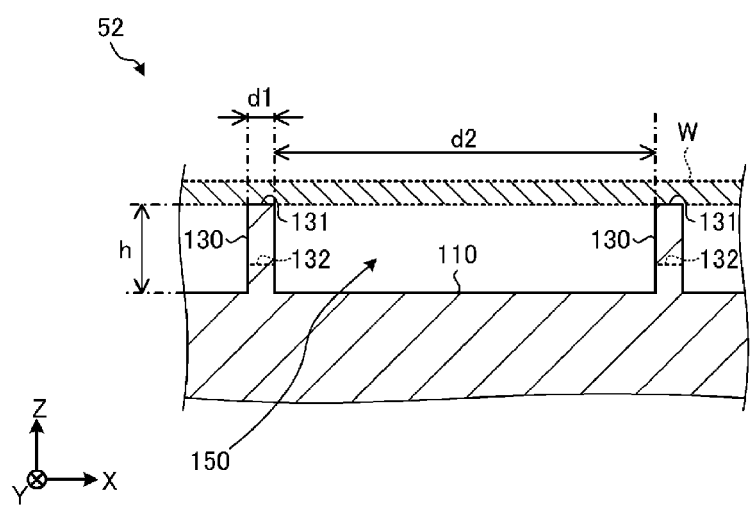
FIG. 5 is a diagram showing an example of a cross section taken along a line X-X of FIG. 4.

First, a configuration of the holder 52 will be explained with reference to FIG. 4 and FIG. 5. FIG. 4 is a plan view of the holder 52 according to the exemplary embodiment. FIG. 5 is a diagram illustrating an example of a cross section taken along a line X-X of FIG. 4.

As depicted in FIG. 4, the holder 52 according to the exemplary embodiment is of a circular shape when viewed from the top. The holder 52 has a diameter smaller than that of the substrate W. By way of example, the diameter of the holder 52 is equal to or less than half the diameter of the substrate W.

The holder 52 has a facing surface 110, a suction opening 120, and a plurality of protrusions 130. The facing surface 110 is positioned under the substrate W, and faces the bottom surface of the substrate W. The facing surface 110 has a circular shape when viewed from the top, and has a diameter equal to that of the holder 52.

The suction opening 120 is provided in a central portion of the facing surface 110. The suction opening 120 is connected to a non-illustrated suction device such as a vacuum pump via a non-illustrated suction pipe.

The plurality of protrusions 130 have an annular shape when viewed from the top, and are concentrically arranged around the suction opening 120. As shown in FIG. 5, the plurality of protrusions 130 are protruded from the facing surface 110 toward the bottom surface of the substrate W, that is, protruded upwards. The plurality of protrusions 130 come into contact with the bottom surface of the substrate W on their upper end surfaces 131. Furthermore, in order to secure a suction path, each protrusion 130 is provided with a communication recess portion 132 through which the inside and the outside of the protrusion 130 in a diametrical direction communicate with each other.

A projecting height of a protrusion belonging to a general vacuum chuck is, for example, 0.3 mm to 0.5 mm. On the other hand, a projecting height h (a vertical distance between the facing surface 110 and the upper end surface 131) of the protrusion 130 according to the exemplary embodiment is equal to or larger than 1 mm. By setting the projecting height h of the protrusion 130 to be high in this way, a thermal influence of the holder 52 on the substrate W in the plating processing can be suppressed.

Figure 6:
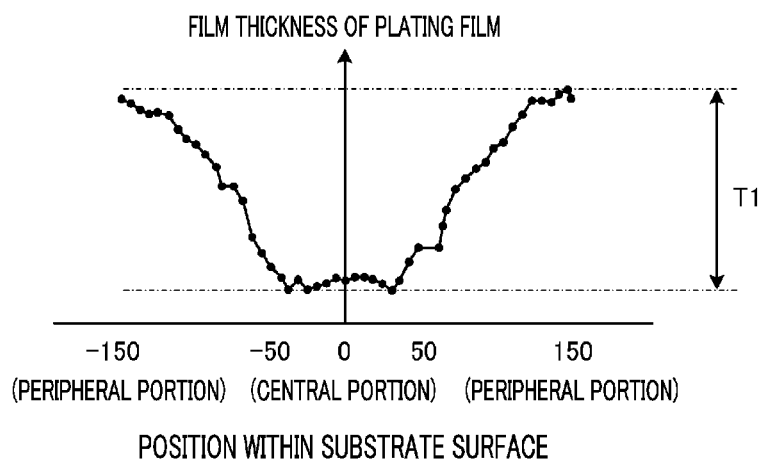
FIG. 6 is a graph showing a film thickness distribution of a plating film when a plating processing is performed by using a holder provided with protrusions having a height of 0.3 mm.
Figure 7:
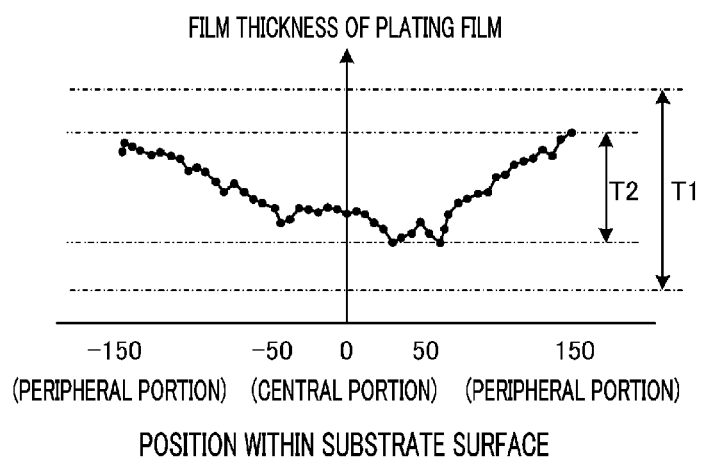
FIG. 7 is a graph showing a film thickness distribution of a plating film when a plating processing is performed by using a holder provided with protrusions having a height of 1.0 mm.

This point will be elaborated with reference to experimental results shown in FIG. 6 and FIG. 7. FIG. 6 is a graph showing a film thickness distribution of a plating film when a plating processing is performed by using the holder having the protrusion with the projecting height h of 0.3 mm. FIG. 7 is a graph showing a film thickness distribution of a plating film when a plating processing is performed by using the holder 52 having the protrusion 130 with the projecting height h of 1 mm. Further, conditions for the plating processing in both experiments are set to be the same except that the projecting heights h are different.

As depicted in FIG. 6 and FIG. 7, a film thickness difference T2 (a difference between a maximum film thickness and a minimum film thickness) of the plating film when the projecting height h is set to be 1 mm is smaller than a film thickness difference T1 of the plating film when the projecting height h is set to be 0.3 mm. As stated above, the thickness of the plating film depends on the temperature of the plating liquid L1. Therefore, the experimental results of FIG. 6 and FIG. 7 may be understood to indicate that the in-surface uniformity of the temperature of the substrate W during the plating processing is improved by changing the projecting height h from 0.3 mm to 1 mm.

The reason for this improvement is assumed as follows, for example. That is, as depicted in FIG. 5, a space 150 is formed between the substrate W and the holder 52 when the substrate W is held by the holder 52. Specifically, the space 150 is surrounded by the facing surface 110 and the two adjacent protrusions 130 of the holder 52 as well as the substrate W. This space 150 functions as a heat insulating space configured to suppress the heat conduction from the substrate W to the holder 52.

The heat insulation performance of the space 150 increases as the volume of the space 150 increases. Therefore, by setting the projecting height h to be high, it is assumed that the volume of the space 150 is increased and the heat insulation performance of the space 150 is improved. As a result, the heat conduction from the substrate W to the holder 52 is suppressed, so that the in-surface uniformity of the temperature of the substrate W during the plating processing is improved. In addition, by setting the projecting height h to be high, the facing surface 110 of the holder 52 is distanced farther from the substrate W. This is also deemed to have the effect of suppressing the heat conduction from the substrate W to the holder 52.

Further, the projecting height h is desirably equal to or larger than 1 mm, but it is not limited thereto as long as it is not less than 0.6 mm.

The heat of the substrate W is transferred to the holder 52 and the rotation shaft 522 via the protrusions 130 in contact with the substrate W. For this reason, it is desirable that a contact area between the protrusions 130 and the substrate W is as small as possible.

From this point of view, in the holder 52 according to the exemplary embodiment, a first width d1, which is the width of the upper end surface 131 of the protrusion 130 in the diametrical direction is set to be smaller than a second width d2, which is the width between the adjacent protrusions 130 in the diametrical direction.

To elaborate, in the holder 52 according to the exemplary embodiment, a ratio of the first width d1 to the second width d2 (a value of the first width d1 when the second width d2 is set to be 1) is, for example, 0.1 or less.

By adopting this configuration, the holder 52 according to the exemplary embodiment is capable of suppressing the heat conduction from the substrate W to the holder 52 appropriately.

<Configuration of Heating Device>

Figure 8:
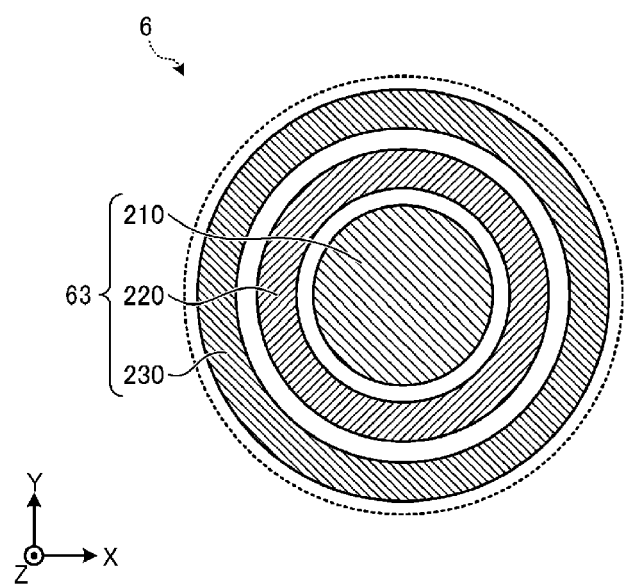
FIG. 8 is a plan view of a heating device according to the exemplary embodiment.
Figure 9:
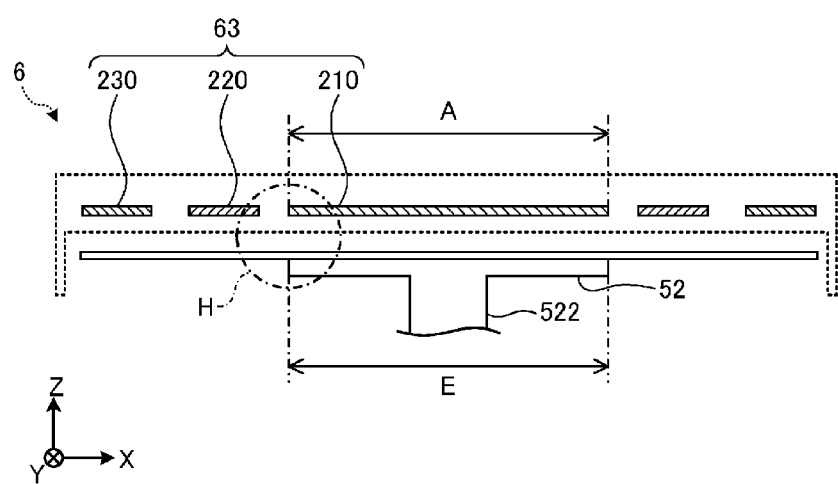
FIG. 9 is a cross sectional view of the heating device according to the exemplary embodiment.
Figure 10:
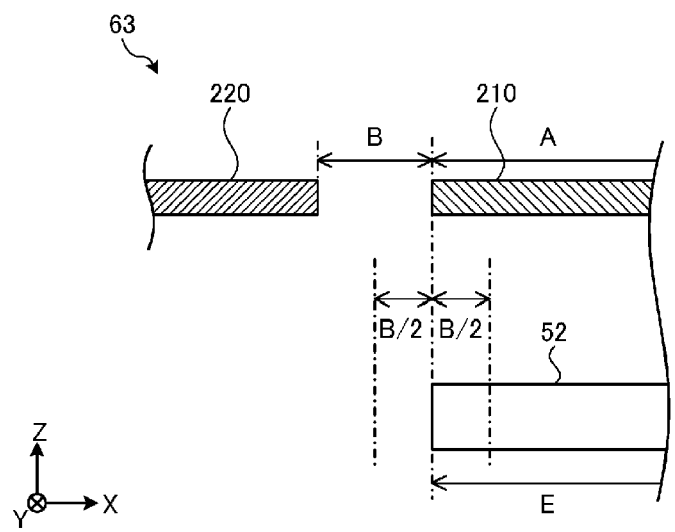
FIG. 10 is an enlarged view illustrating a part of a portion H in FIG. 9.

Next, a configuration of the heating device 63 provided in the cover body 6 will be explained with reference to FIG. 8 to FIG. 10. FIG. 8 is a plan view of the heating device 63 according to the exemplary embodiment, and FIG. 9 is a cross sectional view of the heating device 63 according to the exemplary embodiment. In FIG. 8 and FIG. 9, the heating device 63 is seen through the cover body 6. Further, FIG. 10 is an enlarged view illustrating an example of a portion H shown in FIG. 9.

As illustrated in FIG. 8 and FIG. 9, the heating device 63 according to the exemplary embodiment is equipped with a plurality of individual heating elements 210, 220 and 230 that are configured to be temperature-controlled individually. Among the individual heating elements 210, 220 and 230, a heating region of the individual heating element 210 is of a circular shape when viewed from the top, and is located directly above the holder 52. Heating regions of the individual heating elements 220 and 230 have an annular shape when viewed from the top, and are arranged concentrically around the individual heating element 210. Specifically, the individual heating elements 210, 220 and 230 are arranged concentrically with certain distances therebetween in the order of the individual heating element 220 and the individual heating element 230, centering on the individual heating element 210.

As shown in FIG. 9, the holder 52 is disposed to be concentric with the plurality of individual heating elements 210, 220 and 230. Further, a diameter E of the holder 52 is equal to a diameter A of the individual heating element 210 located directly above the holder 52.

However, the holder 52 may not necessarily have the same diameter as the individual heating element 210. That is, as shown in FIG. 10, if the distance between the individual heating element 210 and the individual heating element 220 adjacent to the individual heating unit 210 is referred to as a distance B, the diameter E of the holder 52 may be equal to or larger than A−(B/2) and equal to or less than A+(B/2).

As described above, the plating unit 5 according to the exemplary embodiment is equipped with the heating device 63 divided into the plurality of individual heating elements 210, 220 and 230 configured to be temperature-controlled individually. This plating unit 5 is capable of improving the in-surface uniformity of the temperature of the substrate W during the plating processing by heating the individual regions of the substrate W to appropriate temperatures through the individual heating elements 210, 220 and 230.

In particular, the heating device 63 according to the exemplary embodiment has, directly above the holder 52, the individual heating element 210 having the same diameter as the holder 52. Accordingly, the temperature of the central portion of the substrate W which tends to be easily affected by the heat of the holder 52 can be suitably controlled by the individual heating element 210.

Figure 11:
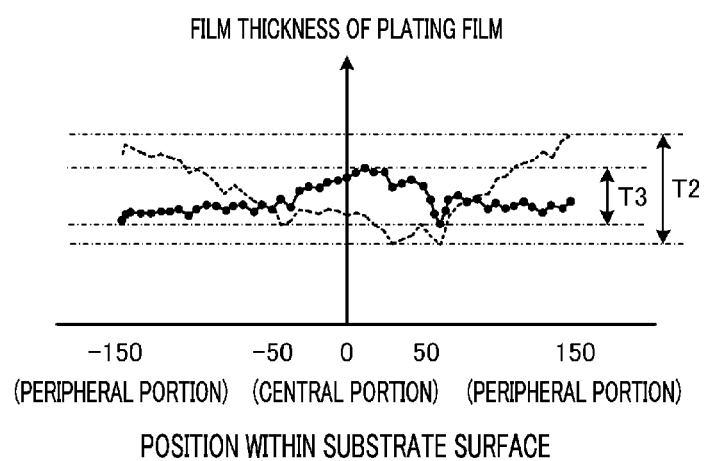
FIG. 11 is a graph showing a film thickness distribution of a plating film when a set temperature of an individual heating element positioned directly above the holder is varied.

FIG. 11 is a graph showing a variation in the film thickness distribution of the plating film when the set temperature of the individual heating element 210 positioned directly above the holder 52 is varied. In FIG. 11, the film thickness distribution when the set temperatures of the individual heating elements 210, 220 and 230 are respectively set to 77° C., 64° C. and 85° C. is indicated by a dashed line, and the film thickness distribution when the set temperatures of the individual heating elements 210, 220 and 230 are respectively set to 87° C., 64° C. and 85° C. is indicated by a solid line.

Conditions of the plating processing in both experiments are the same except that the set temperature of the individual heating element 210 is different, and the projecting height h of the protrusion 130 is 1 mm in both cases. Further, the experimental result indicated by the dashed line in FIG. 11 is the same as the experimental result shown in FIG. 7.

As can be seen from FIG. 11, by changing the set temperature of the individual heating element 210 from 77° C. to 87° C., the thickness of the plating film decreases from T2 to T3. In this way, by setting the temperature of the individual heating element 210 appropriately, the in-surface uniformity of the temperature of the substrate W during the plating processing can be further improved. As a result, the discrepancy in the thickness of the plating film can be made smaller.

<Specific Operation of Plating Unit>

Figure 12:
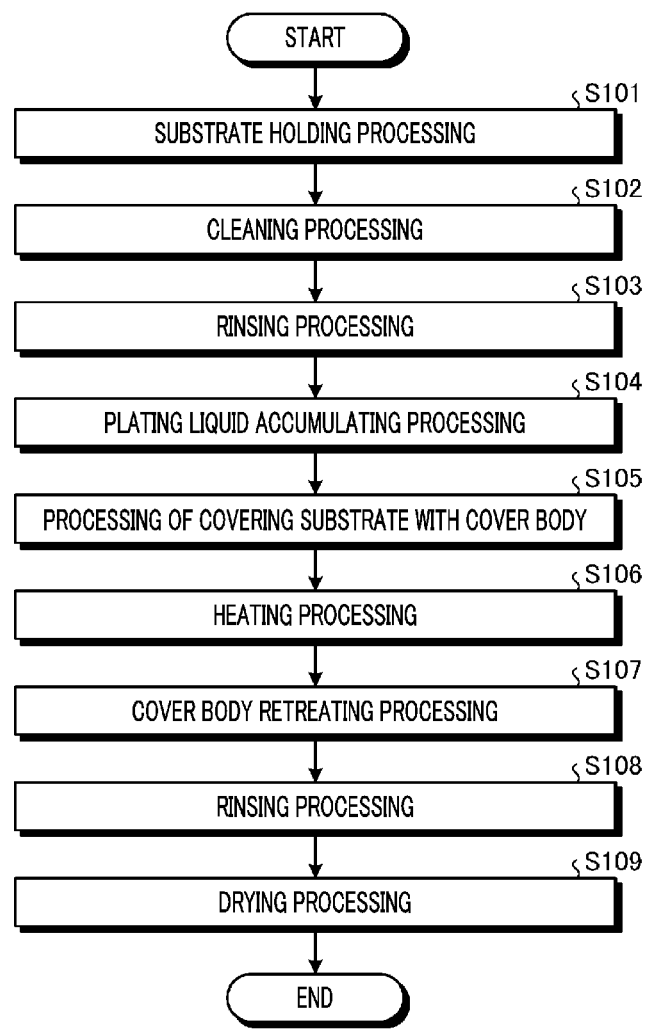
FIG. 12 is a flowchart illustrating a sequence of processings performed by the plating unit according to the exemplary embodiment.

Now, a specific operation of the plating unit 5 will be explained with reference to FIG. 12. FIG. 12 is a flowchart illustrating a sequence of processings performed by the plating unit 5 according to the exemplary embodiment. Further, the series of processings shown in FIG. 12 are performed under the control of the controller 91.

First, as shown in FIG. 12, the substrate W carried in into the plating unit 5 is held by the holder 52 (process S101). Here, the central portion of the bottom surface of the substrate W is vacuum-attracted, and the substrate W is horizontally held by the holder 52.

Next, the substrate W held by the holder 52 is subjected to a cleaning processing (process S102). In this case, the rotation motor 523 is first driven to rotate the substrate W at a predetermined rotation speed. Then, the nozzle arm 56 located at the retreat position (the position indicated by the solid line in FIG. 2) is moved to the discharge position above the center of the substrate W. Next, the cleaning liquid L2 is supplied from the cleaning liquid nozzle 541 to the substrate W being rotated, so that the front surface of the substrate W is cleaned. Accordingly, the deposit or the like adhering to the substrate W is removed from the substrate W. The cleaning liquid L2 supplied on the substrate W is drained into the drain duct 581.

Then, the cleaned substrate W is subjected to a rinsing processing (process S103). In this case, the rinse liquid L3 is supplied from the rinse liquid nozzle 551 to the substrate W being rotated, so that the front surface of the substrate W is rinsed. Accordingly, the cleaning liquid L2 remaining on the substrate W is washed away. The rinse liquid L3 supplied on the substrate W is drained into the drain duct 581.

Thereafter, the plating liquid L1 is supplied to be accumulated on the substrate W after being rinsed (process S104). In this case, the rotation speed of the substrate W is first reduced from the rotation speed in the rinsing processing. For example, the rotation speed of the substrate W may be set to be 50 rpm to 150 rpm. Accordingly, the plating film formed on the substrate W can be made uniform. Further, the rotation of the substrate W may be stopped.

Afterwards, the plating liquid L1 is discharged from the plating liquid nozzle 531 to the front surface of the substrate W. The discharged plating liquid L1 stays on the front surface of the substrate W due to the surface tension. As the plating liquid L1 is accumulated on the front surface of the substrate W, a layer (so-called puddle) of the plating liquid L1 is formed. Some of the plating liquid L1 flows out from the front surface of the substrate W to be drained from the drain duct 581. After a predetermined amount of the plating liquid L1 is discharged from the plating liquid nozzle 531, the discharge of the plating liquid L1 is stopped. Thereafter, the nozzle arm 56 located at the discharge position is placed at the retreat position.

Then, the plating liquid L1 accumulated on the substrate W is heated. First, the substrate W is covered with the cover body 6 (process S105). First, the revolving motor 72 of the cover body moving mechanism 7 is driven, and the cover body 6 is rotated horizontally to be located at the upper position (the position indicated by the dashed double-dotted line in FIG. 2).

Subsequently, the cylinder 73 of the cover body moving mechanism 7 is driven, so that the cover body 6 placed at the upper position is lowered to be positioned at a processing position. Accordingly, the distance between the plating liquid L1 on the substrate W and the first ceiling plate 611 of the cover body 6 becomes a first distance, and the sidewall member 62 of the cover body 6 is placed to surround the substrate W. In the present exemplary embodiment, a lower end of the sidewall member 62 of the cover body 6 is placed at a position lower than the bottom surface of the substrate W. In this way, the substrate W is covered with the cover body 6, and a space around the substrate W is closed.

Then, a heating processing is performed (process S106). Specifically, the heating device 63 is turned on, and the plating liquid L1 accumulated on the substrate W is heated. A set temperature of the heating device 63 is fixed to a constant target temperature through the heating processing for each of the individual heating elements 210, 220 and 230. When the temperature of the plating liquid L1 rises up to a temperature at which a component of the plating liquid L1 is precipitated, the component of the plating liquid L1 is precipitated on the front surface of the seed layer to form the plating film.

Then, a cover body retreating processing is performed (process S107). In the cover body retreating processing, the cover body moving mechanism 7 is driven to locate the cover body 6 at the retreat position. In this case, as the cylinder 73 of the cover body moving mechanism 7 is first driven, the cover body 6 is raised to be placed at the upper position. Then, the revolving motor 72 of the cover body moving mechanism 7 is driven, so that the cover body 6 located at the upper position is rotated horizontally to be placed at the retreat position.

Thereafter, the substrate W is subjected to a rinsing processing (process S108). First, the rotation speed of the substrate W is increased to be higher than the rotation speed in the plating processing. By way of example, the substrate W is rotated at the same rotation speed as in the rinsing processing (process S103) before the plating processing. Then, the rinse liquid nozzle 551 placed at the retreat position is moved to the discharge position. Next, the rinse liquid L3 is supplied from the rinse liquid nozzle 551 to the substrate W being rotated, so the front surface of the substrate W is cleaned. As a result, the plating liquid L1 remaining on the substrate W is washed away.

Next, the rinsed substrate W is subjected to a drying processing (process S109). In this case, the rotation speed of the substrate W is increased to be higher than the rotation speed in the rinsing processing, for example, so that the substrate W is rotated at a high speed (process S108). Accordingly, as the rinse liquid L3 remaining on the substrate W is scattered off, the substrate W is dried.

Upon the completion of the drying processing, the substrate W is taken out from the plating unit 5 by the substrate transfer device 17 and transferred to the delivery unit 14. Further, the substrate W sent to the delivery unit 14 is taken out from the delivery unit 14 by the substrate transfer device 13 and accommodated in the carrier C. Accordingly, the series of processings of the electroless plating on the single sheet of substrate W are ended.

First Modification Example

Figure 13:
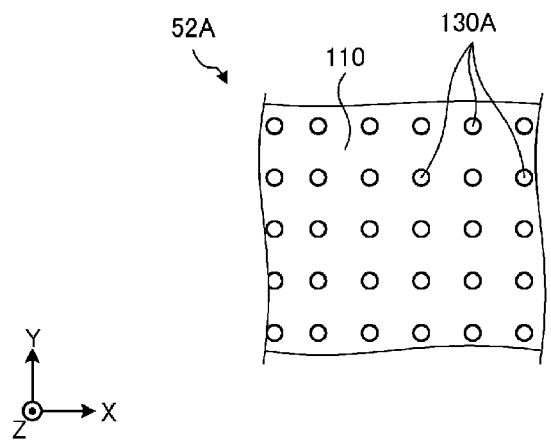
FIG. 13 is a plan view illustrating a part of a holder according to a first modification example.

FIG. 13 is a plan view showing a part of a holder according to a first modification example. In the above-described exemplary embodiment, the holder 52 is provided with the protrusions 130 having the annular shape, when viewed from the top. However, the shape of the protrusion does not necessarily need to be the annular shape when viewed from the top.

By way of example, as shown in FIG. 13, a holder 52A may be equipped with cylindrical (pin-shaped) protrusions 130A. Like the protrusion 130, the protrusion 130A has a projecting height of at least 0.6 mm, more desirably, 1 mm or more.

Second Modification Example

Figure 14:
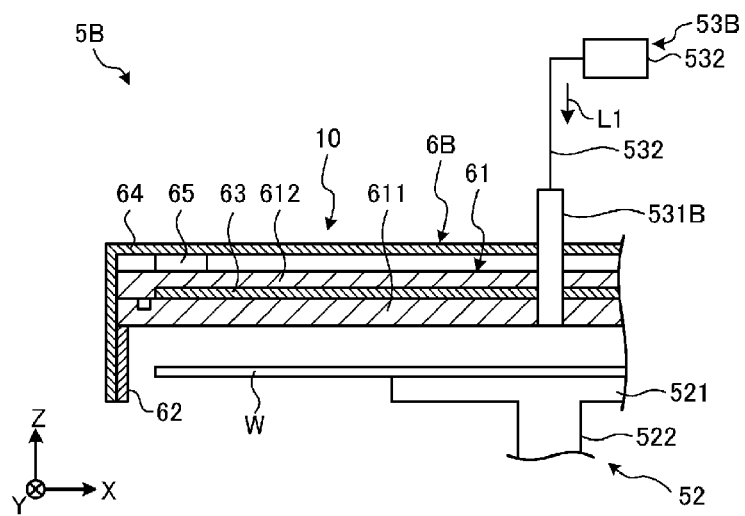
FIG. 14 is a diagram illustrating a configuration of a plating unit according to a second modification example.

FIG. 14 is a diagram showing a configuration of a plating unit according to a second modification example. As illustrated in FIG. 14, a plating unit 5B according to the second modification example has a configuration in which a cover body 6B and a plating liquid nozzle 531B of a plating liquid supply 53B are integrated as one body.

Specifically, the plating liquid nozzle 531B is disposed to penetrate the ceiling member 61, the heating device 63 and the cover lid 64 of the cover body 6B. The plating liquid nozzle 531B is moved along with the cover body 6B by the cover body moving mechanism 7.

Here, the plating liquid nozzle 531B is disposed above the center of the substrate W held by the holder 52, for example. However, the plating liquid nozzle 531B may be placed at a position deviated from above the center of the substrate W.

Figure 15:
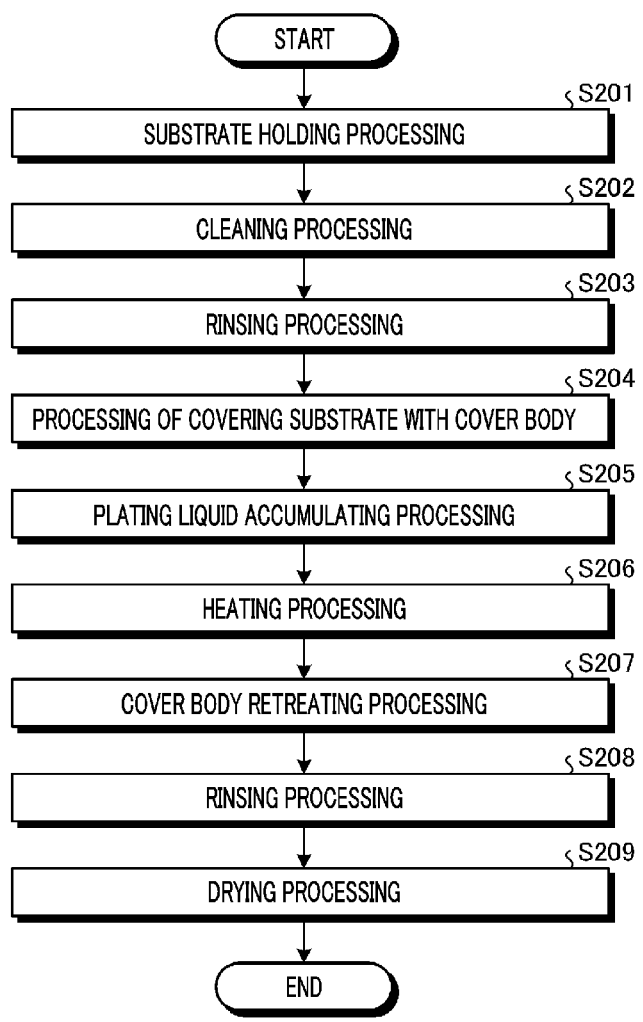
FIG. 15 is a flowchart illustrating a sequence of processings performed by the plating unit according to the second modification example.

Now, a specific operation of the plating unit 5B according to the second modification example will be described with reference to FIG. 15. FIG. 15 is a flowchart showing a sequence of processings performed by the plating unit 5B according to the second modification example.

Among the processings of processes S201 to S209 shown in FIG. 15, the processings other than the processes S204 and S205 are the same as the processings other than the processings S104 and S105 among the processings of the processes S101 to S109 performed by the plating unit 5 according to the exemplary embodiment. Specifically, the processings of the processes S201 to S203 are the same as the processings of the processes S101 to S103, and the processings in the processes S206 to S209 are the same as the processings of the processes S106 to S109.

As illustrated in FIG. 15, in the plating unit 5B according to the second modification example, after a processing (process S204) of covering the substrate W with the cover body 6B, a processing (process S205) of accumulating the plating liquid L1 is performed.

In this way, by supplying the plating liquid L1 to the substrate W after the substrate W is covered with the cover body 6B, a temperature decrease of the plating liquid L1 on the substrate W can be suppressed, as compared to a case where the substrate W is covered with the cover body 6B after the plating liquid L1 is supplied. That is, it is possible to suppress the temperature decrease of the plating liquid L1 that may occur before the cover body 6B is moved to cover the substrate W after the plating liquid L1 is supplied to the substrate W.

Further, in the plating unit 5B, after the substrate W is covered with the cover body 6B in the process S204, the substrate W may be heated preliminarily by turning on the heating device 63 before the plating liquid L1 is supplied.

Further, in the plating unit 5B, when the substrate W is covered with the cover body 6B in the process S204, the cover body 6B may be disposed at a position where the first ceiling plate 611 of the cover body 6B comes into contact with the plating liquid L1 to be accumulated on the substrate W in the process S205. Accordingly, in the subsequent heating processing (process S206), the heat of the heating device 63 can be efficiently transferred to the plating liquid L1. Therefore, the heating efficiency for the plating liquid L1 can be increased.

In case of bringing the cover body 6B into contact with the plating liquid L1, the plating unit 5B may perform the rinsing processing (process S208) and the drying processing (process S209) while keeping the substrate W covered with the cover body 6B. Accordingly, the plating liquid L1 adhering to the first ceiling plate 611 of the cover body 6B can be washed away by the rinse liquid L3, and the first ceiling plate 611 can be dried. In this case, the rinse liquid source 552 may be connected to the plating liquid nozzle 531B via the rinse liquid pipe 553. Further, a drying gas source may be connected to the plating liquid nozzle 531B via a pipeline. Accordingly, in the drying process (process S209), the plating unit 5B is capable of drying the substrate W and the cover body 6B by supplying the drying gas (for example, inert gas such as nitrogen) sent from the drying gas source to the inside of the cover body 6B.

As described above, a substrate processing apparatus (as an example, the plating unit 5) according to the exemplary embodiment includes a holder (as an example, the holder 52 (52A), a supply (as an example, the plating liquid supply 53), and a cover body (as an example, the cover body 6). The holder is configured to attract and hold a substrate (as an example, the substrate W). The supply is configured to supply a heated plating liquid (as an example, the plating liquid L1) to the substrate attracted to and held by the holder. The cover body is configured to cover the substrate attracted to and held by the holder, and configured to heat the plating liquid on the substrate by using a heating device (as an example, the heating device 63) provided in a ceiling member (as an example, the ceiling member 61) facing a top surface of the substrate. Further, the holder includes multiple protrusions (as an example, the plurality of protrusions 130) projecting from a facing surface (as an example, the facing surface 110) facing the bottom surface of the substrate toward a bottom surface of the substrate and each protrusion has a projecting height equal to or larger than 1 mm. Therefore, according to the substrate processing apparatus of the exemplary embodiment, it is possible to improve the in-plane uniformity of the temperature of the substrate during the plating processing.

The multiple protrusions may have an annular shape when viewed from a top, and may be arranged concentrically. In this case, a first width (as an example, the first width d1), which is a width of the protrusion in a diametrical direction, may be smaller than a second width (as an example, the second width d2), which is a width between the adjacent protrusions in the diametrical direction. Therefore, the heat conduction from the substrate to the holder may be suppressed appropriately.

A ratio of the first width to the second width may be equal to or less than 0.1. Thus, the heat conduction from the substrate to the holder can be suppressed more appropriately.

The heating device may have multiple individual heating elements (as an example, the individual heating elements 210, 220 and 230) which are arranged concentrically and configured to be temperature-controlled individually. With this configuration, by heating the individual regions of the substrate to proper temperatures through the multiple individual heating elements, the in-surface uniformity of the temperature of the substrate during the plating processing can be further improved.

The holder may have a diameter smaller than that of the substrate, and may be disposed to be concentric with the multiple individual heating elements. In this case, when a first heating element (as an example, the individual heating element 210) located directly above the holder among the multiple individual heating elements is assumed to have a diameter A, and the distance between the first heating element and a second heating element (as an example, the individual heating element 220) adjacent to the first heating element among the multiple individual heating elements is assumed to be a distance B, the diameter of the holder may be equal to or larger than A−(B/2) and equal to or less than A+(B/2).

The diameter of the holder may be equal to the diameter of the first heating element. With this configuration, the temperature of the central portion of the substrate which is easily affected by the heat of the holder can be appropriately controlled by using the first heating element having the same diameter as the holder.

The holder may be made of a carbon PEEK resin. By using the carbon PEEK resin having relatively high strength, it is easy to maintain the strength even when the width (first width) of the protrusion is small, for example. Furthermore, as the carbon PEEK resin is difficult to thermally deform, it may be suitable for use in the plating processing with heated plating liquid.

The processing liquid supplied to the substrate may be a processing liquid other than the plating liquid. In this case, the substrate processing apparatus may not necessarily need to be equipped with the cover body. That is, the substrate processing apparatus may only include the holder configured to attract and hold the substrate and the supply configured to supply the processing liquid to the substrate attracted to and held by the holder. In addition, a substrate processing method in this case may include attracting and holding the substrate by using the holder having the multiple protrusions each projecting from a facing surface thereof positioned under the substrate, toward the bottom surface of the substrate and each protrusion having a projecting height equal to or larger than 1 mm; and supplying the processing liquid to the attracted/held substrate. In addition, the processing liquid other than the plating liquid may be a heated processing liquid.

According to the substrate processing apparatus and the substrate processing method of the exemplary embodiment, the in-surface uniformity of the temperature of the substrate during the liquid processing can be improved. That is, by setting the projecting height of the protrusion to be high, the heat insulation performance of the space 150 (see FIG. 5) is improved, and the heat conduction from the substrate to the holder is suppressed. Therefore, the in-surface uniformity of the temperature of the substrate during the liquid processing can be improved.

Furthermore, the processing liquid other than the plating liquid is not particularly limited. As an example, the processing liquid may be HF (hydrofluoric acid), SC1 (a mixed solution of ammonia, hydrogen peroxide, and water), SC2 (a mixed solution of hydrochloric acid, hydrogen peroxide, and water), SPM (a mixed solution of sulfuric acid, hydrogen peroxide and water), ammonia water, DIW (deionized water), IPA (isopropyl alcohol), or the like. Further, the processing liquid may be a resist liquid for forming a coating film on the front surface of the substrate, a liquid for forming an anti-reflection film, a liquid for forming a SOG (Spin on Glass) film, a liquid for forming an underlying film, or the like.

It should be noted that the above-described exemplary embodiment is illustrative in all aspects and is not anyway limiting. The above-described exemplary embodiment may be omitted, replaced and modified in various ways without departing from the scope and the spirit of claims.

According to the exemplary embodiments, it is possible to improve the in-surface uniformity of the substrate temperature during the plating processing.

We claim:

1. A substrate processing apparatus, comprising:
a holder configured to attract and hold a substrate;
a supply configured to supply a heated plating liquid to the substrate attracted to and held by the holder; and
a cover body configured to cover the substrate attracted to and held by the holder, and configured to heat the plating liquid on the substrate by using a heating device provided in a ceiling member thereof facing a top surface of the substrate,
wherein the holder is provided with multiple protrusions projecting from a facing surface thereof facing a bottom surface of the substrate toward the bottom surface of the substrate, and each protrusion has a protruding height equal to or larger than 1 mm relative to the facing surface, and
the holder is configured to attract and hold the substrate such that the bottom surface of the substrate is in contact with upper end surfaces of the multiple protrusions.

2. The substrate processing apparatus of claim 1,
wherein the multiple protrusions have an annular shape when viewed from a top, and are arranged concentrically.

3. The substrate processing apparatus of claim 2,
wherein a first width, which is a width of the protrusion in a diametrical direction, is smaller than a second width which is a width between the adjacent protrusions in the diametrical direction.

4. The substrate processing apparatus of claim 3,
wherein a ratio of the first width to the second width is equal to or less than 0.1.

5. The substrate processing apparatus of claim 1,
wherein the heating device comprises multiple individual heating elements that are arranged concentrically and configured to be temperature-controlled individually.

6. The substrate processing apparatus of claim 1,
wherein the holder is made of a carbon PEEK resin.

7. The substrate processing apparatus of claim 2,
wherein the heating device comprises multiple individual heating elements that are arranged concentrically and configured to be temperature-controlled individually.

8. A substrate processing method for use with the apparatus of claim 1, the method comprising:
attracting and holding a substrate by using a holder which is provided with multiple protrusions projecting from a facing surface thereof positioned under the substrate toward a bottom surface of the substrate, and each protrusion having a protruding height equal to or larger than 1 mm, wherein the holder is configured to attract and hold the substrate such that the bottom surface of the substrate is in contact with upper end surfaces of the multiple protrusions;

supplying a heated plating liquid to the attracted/held substrate;

covering the substrate with a cover body before or after the supplying of the plating liquid; and heating the plating liquid on the substrate by using a heating device provided in a ceiling member of the cover body facing a top surface of the substrate, while keeping the substrate covered with the cover body.

9. A substrate processing method for use with the apparatus of claim 1, the method comprising:

attracting and holding a substrate by using a holder which is provided with multiple protrusions each projecting from a facing surface thereof positioned under the substrate toward a bottom surface of the substrate, and each protrusion having a protruding height equal to or larger than 1 mm, wherein the holder is configured to attract and hold the substrate such that the bottom surface of the substrate is in contact with upper end surfaces of the multiple protrusions; and supplying a processing liquid to the attracted/held substrate.

10. A substrate processing apparatus, comprising:

a holder configured to attract and hold a substrate;

a supply configured to supply a heated plating liquid to the substrate attracted to and held by the holder; and a cover body configured to cover the substrate attracted to and held by the holder, and configured to heat the plating liquid on the substrate by using a heating device provided in a ceiling member thereof facing a top surface of the substrate, wherein the holder is provided with multiple protrusions projecting from a facing surface thereof facing a bottom surface of the substrate toward the bottom surface of the substrate, and each protrusion has a protruding height equal to or larger than 1 mm, the heating device comprises multiple individual heating elements that are arranged concentrically and configured to be temperature-controlled individually, the holder has a diameter smaller than that of the substrate, and is disposed to be concentric with the multiple individual heating elements, and when a first heating element located directly above the holder among the multiple individual heating elements is assumed to have a diameter A and a distance between the first heating element and a second heating element adjacent to the first heating element among the multiple individual heating elements is assumed to be a distance B, the diameter of the holder may be equal to or larger than A−(B/2) and equal to or less than A+(B/2).

11. The substrate processing apparatus of claim 10, wherein the diameter of the holder is equal to the diameter of the first heating element.

12. The substrate processing apparatus of claim 10, wherein the multiple protrusions have an annular shape when viewed from a top, and are arranged concentrically.

13. The substrate processing apparatus of claim 12, wherein a first width, which is a width of the protrusion in a diametrical direction, is smaller than a second width which is a width between the adjacent protrusions in the diametrical direction.

14. The substrate processing apparatus of claim 13, wherein a ratio of the first width to the second width is equal to or less than 0.1.

15. The substrate processing apparatus of claim 10, wherein the holder is made of a carbon PEEK resin.

* * * * *